United States Patent
Fujiwara et al.

(10) Patent No.: US 9,257,172 B2
(45) Date of Patent: Feb. 9, 2016

(54) MULTI-PORT MEMORY CELL

(71) Applicant: TAIWAN SEMICONDUCTOR MANUFACTURING COMPANY, LTD., Hsinchu (TW)

(72) Inventors: Hidehiro Fujiwara, Hsinchu (TW); Kao-Cheng Lin, Taipei (TW); Yen-Huei Chen, Jhudong Township (TW); Hung-Jen Liao, Hsinchu (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 83 days.

(21) Appl. No.: 14/193,456

(22) Filed: Feb. 28, 2014

(65) Prior Publication Data
US 2015/0248927 A1 Sep. 3, 2015

(51) Int. Cl.
| G11C 7/10 | (2006.01) |
| G11C 11/419 | (2006.01) |
| G11C 5/02 | (2006.01) |
| G11C 5/06 | (2006.01) |
| G11C 7/22 | (2006.01) |

(52) U.S. Cl.
CPC ............... *G11C 11/419* (2013.01); *G11C 5/02* (2013.01); *G11C 5/06* (2013.01); *G11C 7/106* (2013.01); *G11C 7/1051* (2013.01); *G11C 7/1057* (2013.01); *G11C 7/1078* (2013.01); *G11C 7/22* (2013.01)

(58) Field of Classification Search
CPC ...... G11C 7/1051; G11C 7/1078; G11C 7/22; G11C 7/106; G11C 7/1057
USPC ............... 365/189.05, 230.08, 185.2, 189.09
See application file for complete search history.

(56) References Cited

U.S. PATENT DOCUMENTS

2002/0131294 A1* 9/2002 Forbes ................. G11C 11/412
365/154

* cited by examiner

*Primary Examiner* — Jason Lappas
(74) *Attorney, Agent, or Firm* — Hauptman Ham, LLP

(57) ABSTRACT

A circuit includes a first data line, a second data line, a reference node, and a memory cell. The reference node is configured to have a reference voltage level corresponding to a first logical value. The memory cell includes a data node, a first transistor and a second transistor connected in series between the first data line and the reference node, and a third transistor between the data node and the second data line. A gate of the first transistor is coupled to the data node, and the first transistor is configured to be turned off when the gate of the first transistor has a voltage level corresponding to the first logical value. The third transistor is configured to be turned off when a gate of the third transistor has a voltage level corresponding to a second logical value different from the first logical value.

20 Claims, 13 Drawing Sheets

MULTI-PORT MEMORY CELL

BACKGROUND

A two port memory cell includes a write port and a read port. The read port includes a read data line that is configured to carry the data read from the memory cell. The write port includes a write data line that is configured to carry the data to be written to the memory cell. In some configurations, the write data line is precharged and/or kept at a predetermined voltage level when the write data line is not used for writing the memory cell. When a write word line is activated to access another memory cell of the same row, the write data line is also coupled to the memory cell responsive to the activated write word line. As a result, the predetermined voltage level at the write data line interferes with a voltage level at a data node of the memory cell. Meanwhile, if a read word line is activated to access the memory cell, the interference of the voltage level at the data node would also interfere with setting a voltage level at the read data line that reflects the logical value stored in the memory cell. In some applications, the interference at the read data line of one memory cell caused by the write operation of another memory cell is sometimes referred to as a "read disturbance" or a "read disturb."

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
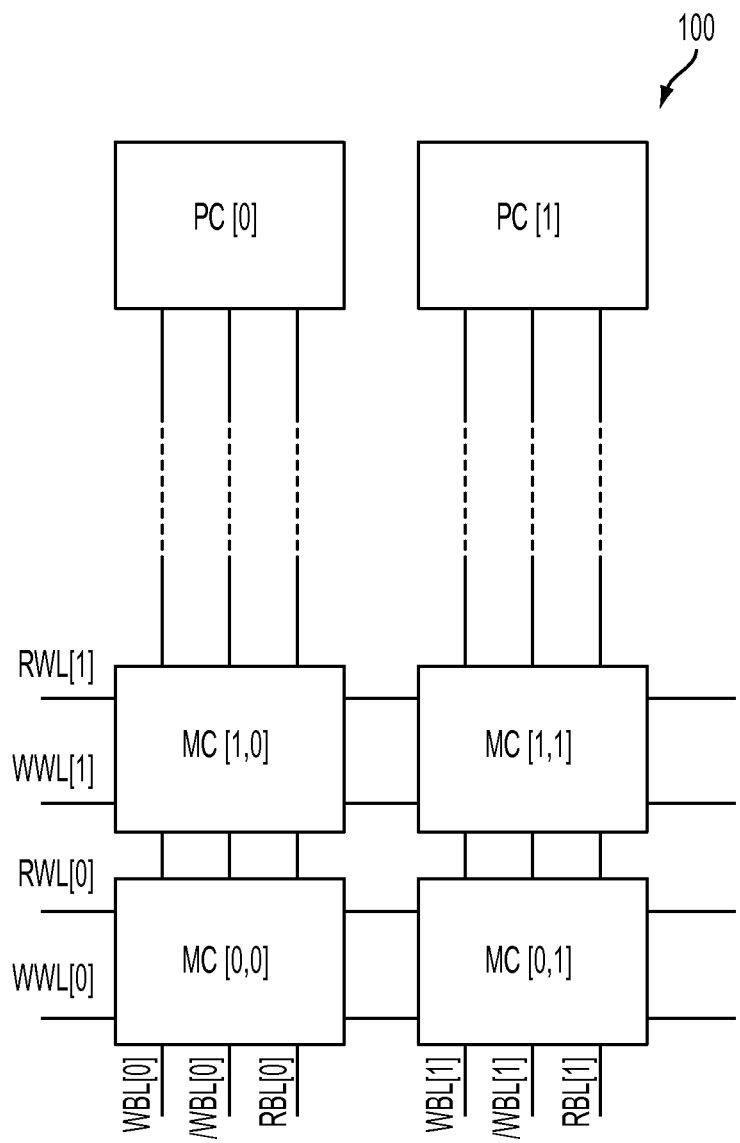
FIG. 1 is a diagram of a portion of a memory circuit in accordance with some embodiments.

The following disclosure provides many different embodiments, or examples, for implementing different features of the invention. Specific examples of components and arrangements are described below to simplify the present disclosure. These are merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some embodiments of the present disclosure, a write bit line coupled to a data node of a memory cell is precharged to or pulled toward a voltage level corresponding to a first logical level. A gate of a transistor of a read port of the memory cell is coupled to the data node of the memory cell. The transistor is configured to be turned off when the gate of the transistor has a voltage level corresponding to the first logical level and to be turned on when the gate of the transistor has a voltage level corresponding to a second logical level. Therefore, the transistor would not be turned on as a result of a read disturb when the data node stores the first logical value.

FIG. 1 is a diagram of a portion of a memory circuit 100 in accordance with some embodiments. Memory circuit 100 includes memory cells MC[0,0], MC[0,1], MC[1,0], and MC[1,1], read word lines RWL[0] and RWL[1], write word lines WWL[0] and WWL[1], read bit lines RBL[0], RBL[1], write bit lines WBL[0], /WBL[0], WBL[1], and /WBL[1], and precharging units PC[0] and PC[1].

Memory cells MC[0,0], MC[0,1], MC[1,0], and MC[1,1] are arranged into rows and columns. In FIG. 1, only four memory cells arranged into two rows and two columns are depicted for illustration purposes. In some embodiments, memory circuit 100 includes more than two rows of memory cells and/or more than two columns of memory cells. In some embodiments, memory circuit 100 includes about 8 to 256 rows of memory cells and 8 to 256 columns of memory cells.

Memory cells MC[0,0], MC[0,1], MC[1,0], and MC[1,1] are two-port memory cells each including a read port and a write port. The read port is associated with a corresponding read word line and a corresponding read bit line. The write port is associated with a corresponding write word line and one or more corresponding write bit lines. A memory cell is selected for a read operation if the corresponding read word line and read bit line are activated. A memory cell is selected for a write operation if the corresponding write word line and write bit lines are activated. In some embodiments, memory cells of memory circuit are multi-port memory cells each including two or more read ports and a write port.

In FIG. 1, each column of memory cells of memory circuit 100 is coupled with a pair of write bit lines and a read bit line. For example, the column of memory cells that includes memory cells MC[0,0] and MC[1,0] is coupled with bit lines RBL[0], WBL[0], and /WBL[0]. Read bit line RBL[0] is a data line configured to carry data read from memory cell MC[0,0] or MC[1,0]. Write bit lines WBL[0], and /WBL[0] are data lines configured to carry data to be written into memory cell MC[0,0] or MC[1,0]. Also, the column of memory cells that includes memory cells MC[0,1] and MC[1, 1] is coupled with bit lines RBL[1], WBL[1], and /WBL[1]. Read bit line RBL[1] is a data line configured to carry data read from memory cell MC[0,0] or MC[1,0]. Write bit lines WBL[1], and /WBL[1] are data lines configured to carry data to be written into memory cell MC[0,1] or MC[1,1].

Furthermore, in FIG. 1, each row of memory cells of memory circuit 100 is coupled with a read word line and a write word line. For example, the row of memory cells that includes memory cells MC[0,0] and MC[0,1] is coupled with read word line RWL[0] and write word line WWL[0]. Read word line RWL[0] carries a control signal for causing transfer of data from memory cell MC[0,0] or MC[0,1] to corresponding read bit line RBL[0] or RBL[1]. Write word line RWL[0] carries a control signal for causing transfer of data from write bit lines WBL[0] and /WBL[0] to memory cell MC[0,0] or from write bit lines WBL[1] and /WBL[1] to MC[0,1]. Also, the row of memory cells that includes memory cells MC[1,0] and MC[1,1] is coupled with read word line RWL[1] and write word line WWL[1]. Read word line RWL[1] carries a control signal for causing transfer of data from memory cell MC[1,0] or MC[1,1] to corresponding read bit line RBL[0] or RBL[1]. Write word line RWL[1] carries a control signal for causing transfer of data from write bit lines WBL[0] and /WBL[0] to memory cell MC[1,0] or from write bit lines WBL[1] and /WBL[1] to MC[1,1].

Precharging unit PC[0] is coupled with data linesj WBL [0], /WBL[0], and RBL[0]. In some embodiments, precharging unit PC[0] is configured to precharge data line WBL[0], /WBL[0], or RBL[0] to a predetermined voltage level when word lines RWL[0], RWL[1], WWL[0], and WWL[1] are deactivated. In some embodiments, precharging unit PC[0] is configured to pull data line WBL[0], /WBL[0], or RBL[0] toward the predetermined voltage level. Also, precharging unit PC[1] is coupled with data lines WBL[1], /WBL[1], and RBL[1]. In some embodiments, precharging unit PC[1] is configured to precharge data line WBL [1], /WBL[1], or RBL[1] to the predetermined voltage level when word lines RWL[0], RWL[1], WWL[0], and WWL[1] are deactivated. In some embodiments, precharging unit PC[1] is configured to pull data line WBL[1], /WBL[1], or RBL[1] toward the predetermined voltage level. In some embodiments, the predetermined voltage level corresponds to a logical value, such as a logical high value or a logical low value.

In some embodiments, memory cells MC[0,0], MC[0,1], MC[1,0], and MC[1,1] are configured as static random access memory (SRAM) cells. In some embodiments, memory cells MC[0,0], MC[0,1], MC[1,0], and MC[1,1] are dynamic random access memory (DRAM) cells or non-volatile memory cells.

Figure 2:
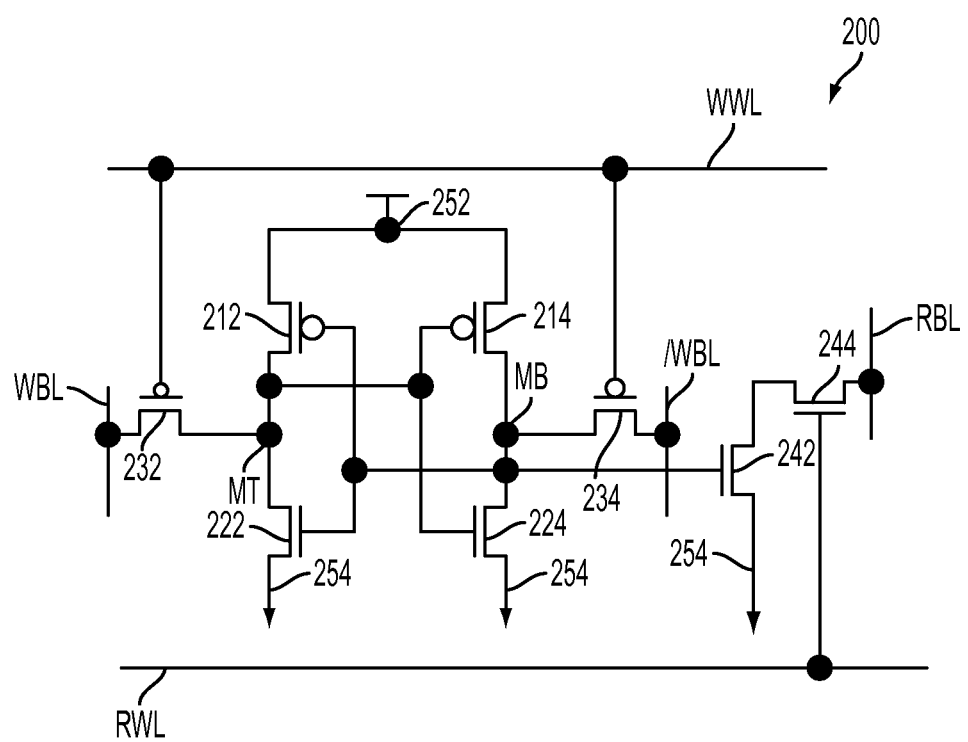
FIG. 2 is a diagram of a memory cell in accordance with some embodiments.

FIG. 2 is a diagram of a memory cell 200 in accordance with some embodiments. In some embodiments, memory cell 200 is usable in a memory circuit, such as memory circuit 100 in FIG. 1.

Memory cell 200 includes two P-type transistors 212 and 214 and two N-type transistors 222 and 224 forming a storage unit, another two P-type transistors 232 and 234 as a part of the write port of memory cell 200, and another two N-type transistors 242 and 244 as a part of the write port of memory cell 200. The write port is further associated with write word line WWL and write bit lines WBL and /WBL. The read port is further associated with read word line RWL and read bit line RBL. Read word line RWL corresponds to word line RWL[0] or RWL[1] in FIG. 1, and write word line WWL corresponds to word line WWL[0] or WWL[1] in FIG. 1. Read bit line RBL corresponds to bit line RBL[0] or RBL[1] in FIG. 1, and write bit line WBL and /WBL correspond to word line WBL[0] and /WBL[0] or WBL[1] and /WBL[1] in FIG. 1.

Memory cell 200 further includes two reference nodes 252 and 254. Reference node 252 is configured to have a first reference voltage level corresponding to a logical high value. Reference node 254 is configured to have a second reference voltage level corresponding to a logical low value.

The word lines WWL and RWL are also shared by other memory cells in the same row of memory cell 200. The bit lines WBL, /WBL, and RBL are also shared by other memory cells in the same column of memory cell 200. In some embodiments, only one of the write bit lines WBL or /WBL is used for memory cell 200, and thus the other one of the write bit lines is omitted.

Transistors 212, 214, 222, and 224 form a pair of cross-coupled inverters between reference nodes 252 and 254. Transistors 212 and 222 form a first inverter while transistors 214 and 224 form a second inverter. Drains of transistors 212 and 222 are coupled together and form a data node MT. Drains of transistors 214 and 224 are coupled together and form a data node MB. Gates of transistors 212 and 222 are coupled together and to drains of transistors 214 and 224. Gates of transistors 214 and 224 are coupled together and to drains of transistors 212 and 222.

Transistor 232 is coupled between bit line WBL and data node MT. Transistor 234 is coupled between bit line /WBL and data node MB. Write word line WWL is coupled with gates of transistors 232 and 234. Transistors 232 and 234 function as pass gates controlled by write word line WWL. In some embodiments, write word line WWL is also coupled with gates of transistors corresponding to transistors 232 and 234 in other memory cells in the same row of memory cell 200. Write word line WWL is also called a write control line because the signal on write word line WWL controls transistors 232 and 234 for data on write bit lines WBL and /WBL to be written to corresponding nodes MT and MB.

When memory cell 200 is accessed for a write operation, data to be written to memory cell 200 is applied to write bit lines WBL and /WBL. Write word line WWL is then activated, such as being set to have the logical low value, to turn on transistors 232 and 234. As a result, the data on bit lines WBL and /WBL is transferred to and is stored in corresponding data nodes MT and MB.

Transistor 242 has a source coupled to reference node 254, a gate coupled to data node MB, and a drain coupled to transistor 244. Transistor 242 is configured to be turned off when the gate of transistor 242 has a voltage level corresponding to the logical low value, and to be turned on when the gate of transistor 242 has a voltage level corresponding to the logical high value.

Transistor 244 is coupled between read bit line RBL and the drain of transistor 242. Read word line RWL is coupled with a gate of transistor 244. Transistor 244 functions as a pass gate controlled by read word line RWL. In some embodiments, read word line RWL is also coupled with gates of transistors corresponding to transistor 244 in other memory cells in the same row of memory cell 200.

When memory cell 200 is accessed for a read operation, read bit line is precharged to a voltage level corresponding to the logical high value. Then, read word line RWL is activated, such as being set to have the logical high value, to turn on transistor 244, and the drain of transistor 242 and read bit line RBL are electrically coupled together. If data node MB has a voltage level corresponding to the logical low value, transistor 242 is turned off and read bit line RBL remains at a logical high level. If data node MB has a voltage level corresponding to the logical high value, transistor 242 is turned on and pull read bit line RBL toward the voltage level at the reference node 254.

Figure 3A:
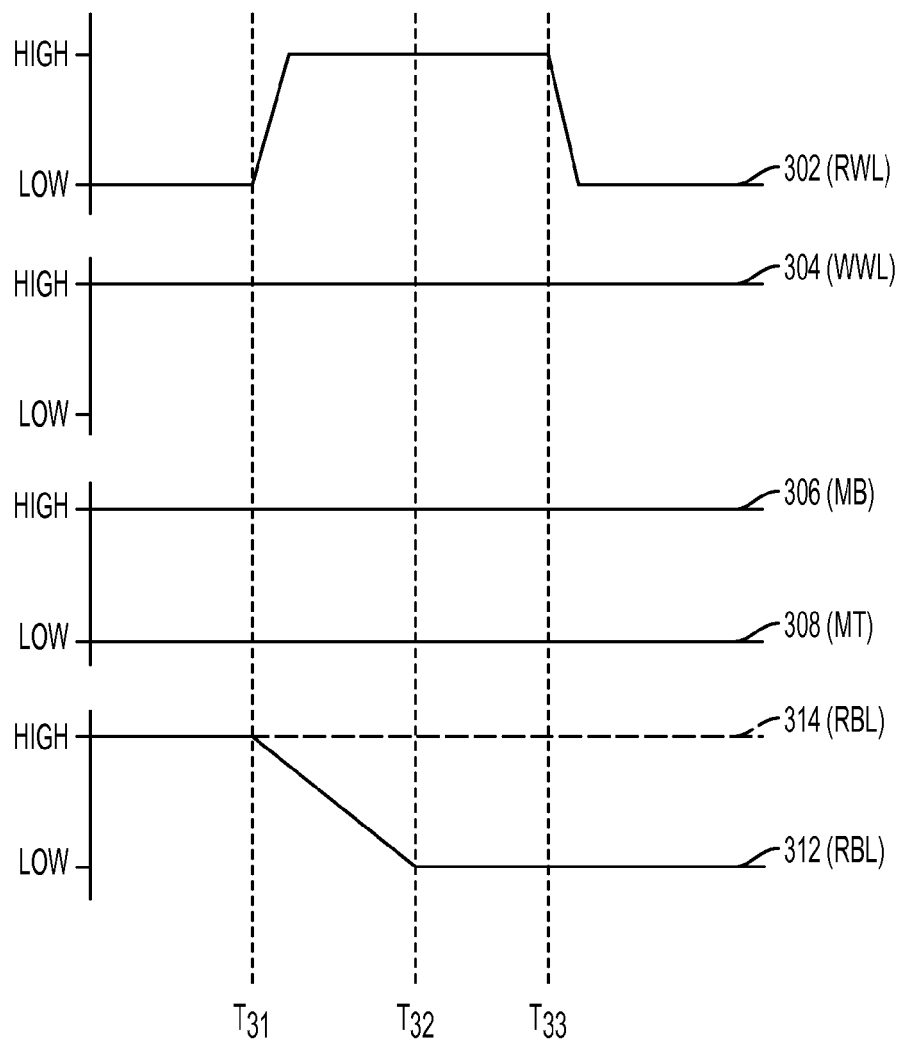
FIGS. 3A-3C are graphs of waveforms of various signals of the memory cell in FIG. 2 in accordance with some embodiments.

FIG. 3A is a graph of waveforms of various signals of the memory cell 200 in FIG. 2 in accordance with some embodiments. Curve 302 represents the signal on read word line RWL; curve 304 represents the signal on write word line WWL; curve 306 represents the signal on data node MB; curve 308 represents the signal on data node MT; and curve 312 represents the signal on read bit line RBL. Moreover, curve 314, depicted as a dotted line, represents the signal on read bit line RBL when the signal on data node MB has the waveform of curve 308 and the signal on data node MT has the waveform of curve 306.

FIG. 3A shows waveforms of various signals when memory cell 200 is accessed for a read operation without the read disturb. In other words, when the read word line RWL is set to have the logical high value to turn on transistor 244, the write word line WWL remains to have the logical high value to turn off transistors 232 and 234.

At time $T_{31}$, the signal 302 at read word line RWL starts to transition from a voltage level corresponding to the logical low value to a voltage level corresponding to the logical high value, and thus starts to turn on transistor 244. After transistor 244 is turned on, read bit line RBL is electrically coupled to the drain of transistor 242. The signal 304 at write word line WWL remains at the logical high value to turn off transistors 232 and 234. As a result, write bit lines WBL and /WBL are electrically decoupled from data nodes MT and MB. Meanwhile, data node MB (306) has the logical high value and data node MT (308) has the logical low value prior to time $T_{31}$. Because transistors 232 and 234 remain off after time $T_{31}$, signal 306 at data node MB and signal 308 at data node MT remain the same after time $T_{31}$.

Prior to time $T_{31}$, a voltage level at read bit line RBL (312) is precharged to the logical high value. Because signal 306 at data node MB has the logical high value, at time $T_{31}$, transistor 242 is turned on to electrically couple the drain of transistor 242 with reference node 254. As a result, the voltage level at read bit line RBL (312) starts to be pulled toward the voltage level at reference node 254, which represents the logical low value.

At time $T_{32}$, the signal 312 at read bit line RBL reaches the voltage level at reference node 254. Then, at time $T_{33}$, the signal 302 at read word line RWL starts to transition from the logical high value to the logical low value, and thus starts to turn off transistor 244. The read bit line RBL now has the logical low value indicating the data stored at node MT, or logically complementary to the data stored at node MB.

Furthermore, when the signal on data node MB has the waveform of curve 308 and the signal on data node MT has the waveform of curve 306, transistor 242 remains off throughout the time period including time $T_{31}$, $T_{32}$, and $T_{33}$. As a result, read bit line RBL is not electrically coupled to reference node 254, and signal 314 at read bit line RBL remains at the logical high value. After time $T_{33}$, the read bit line RBL has the logical high value indicating the data stored at node MT, or logically complementary to the data stored at node MB.

Other circuits, such as one or more of a sense amplifier, a local input/output circuit, or a global input/output circuit are used to output a read data signal according to the logical value of the read bit line RBL.

Figure 3B:
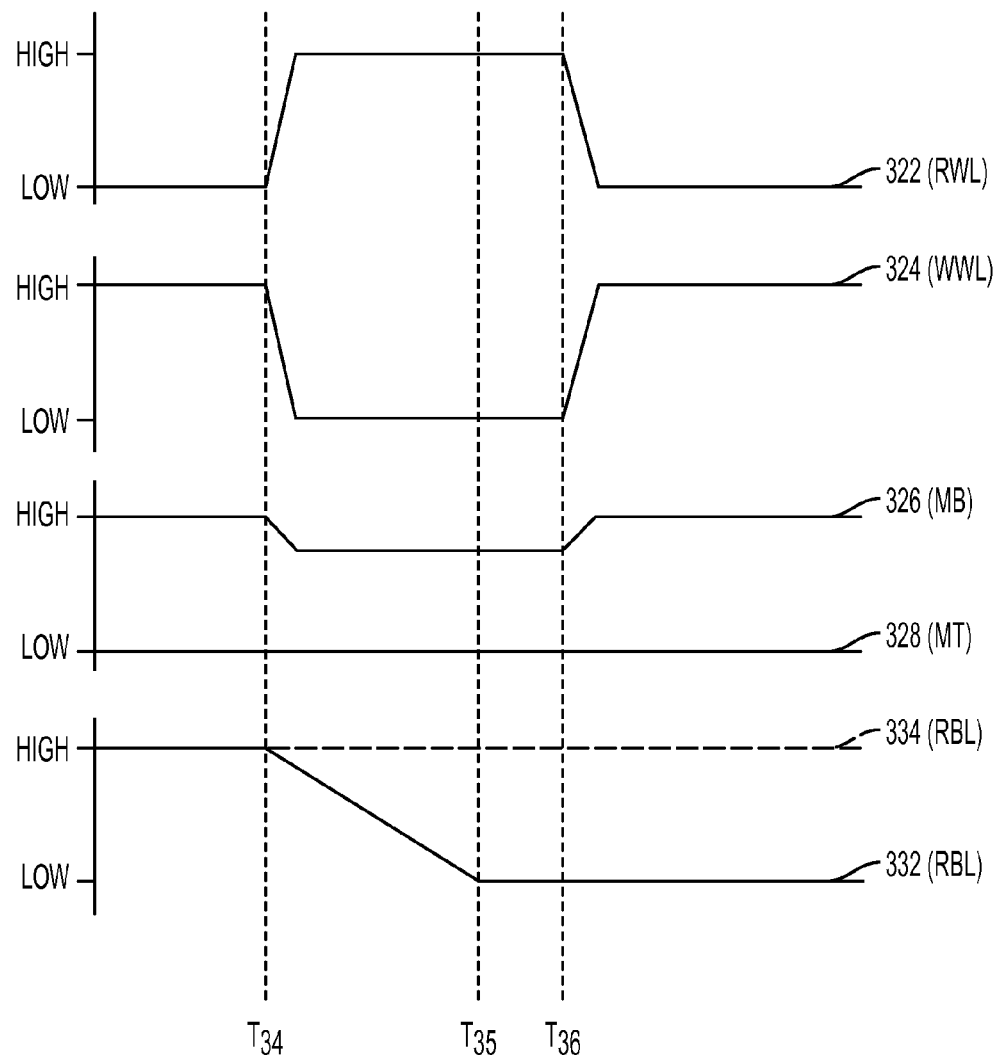

FIG. 3B is a graph of waveforms of various signals of the memory cell 200 in FIG. 2 in accordance with some embodiments. Curve 322 represents the signal on read word line RWL; curve 324 represents the signal on write word line WWL; curve 326 represents the signal on data node MB; curve 328 represents the signal on data node MT; and curve 332 represents the signal on read bit line RBL. Moreover, curve 334, depicted as a dotted line, represents the signal on read bit line RBL when the signal on data node MB has the waveform of curve 328 and the signal on data node MT has the waveform of curve 326.

FIG. 3B shows waveforms of various signals when memory cell 200 is accessed for a read operation with the read disturb. In other words, when the read word line RWL is set to have the logical high value to turn on transistor 244, the write word line WWL is also set to have the logical low value to turn on transistors 232 and 234. However, because the write port of memory cell 200 is not in fact selected for a write operation, write data line WBL and /WBL remain at a predetermined voltage level corresponding to the logical low value set by a corresponding precharging unit.

At time $T_{34}$, the signal 322 at read word line RWL starts to transition from the logical low value to the logical high value, and thus starts to turn on transistor 244. After transistor 244 is turned on, read bit line RBL is electrically coupled to the drain of transistor 242. The signal 324 at write word line WWL also starts to transition from the logical high value to the logical low value, and starts to turn on transistors 232 and 234. After transistors 232 and 234 are turned on, write bit line WBL is electrically coupled to data node MT, and write bit line /WBL is electrically coupled to data node MB.

Meanwhile, data node MB (326) has the logical high value and data node MT (328) has the logical low value prior to time $T_{34}$. Because transistor 232 is turned on and write bit line /WBL is precharged or pulled toward the logical low value by the corresponding prechargind unit, the signal 326 at data node MB is pulled toward the voltage level that represents the logical low value. The signal 328 at data node MT remains at about the logical low value, because write bit line WBL is precharged or kept at the logical low value by the corresponding prechargind unit. In some embodiments, memory cell 200 is configured in a manner that the fluctuation of the signal 326 at data node MB is insufficient to cause the cross-coupled inverters formed by transistors 212, 214, 222, and 225 to flip the logical values stored at data nodes MB and MT.

Prior to time $T_{34}$, a voltage level at read bit line RBL (332) is precharged to the logical high value. Because signal 326 at data node MB has the logical high value, at time $T_{34}$, transistor 242 is turned on to electrically couple the drain of transistor 242 with reference node 254. As a result, the voltage level at read bit line RBL (332) starts to be pulled toward the voltage level at reference node 254, which represents the logical low value. However, after time $T_{34}$, because the signal 326 at data node MB is pulled away from the logical high value, transistor 242 is biased to have less driving capability in comparison with transistor 242 without the read disturb as depicted in FIG. 3A.

At time $T_{35}$, the signal 332 at read bit line RBL reaches the voltage level at reference node 254. Because transistor 242 under read disturb has less driving capability than transistor 242 has without the read disturb, a time interval between $T_{33}$ and $T_{35}$ is longer than that between $T_{31}$ and $T_{32}$. Then, at time $T_{36}$, the signal 322 at read word line RWL starts to transition from the logical high value to the logical low value, and thus starts to turn off transistor 244. The read bit line RBL now has the logical low value indicating the data stored at node MT, or logically complementary to the data stored at node MB.

Furthermore, when the signal on data node MB has the waveform of curve 328 and the signal on data node MT has the waveform of curve 326, transistor 242 remains off throughout the time period including time $T_{34}$, $T_{35}$, and $T_{36}$. As a result, read bit line RBL is not electrically coupled to reference node 254, and signal 334 at read bit line RBL remains at the high logical value. After time $T_{36}$, the read bit line RBL has the logical high value indicating the data stored at node MT, or logically complementary to the data stored at node MB.

In some configurations, write bit line WBL and write bit line /WBL are precharged or pulled toward a voltage level corresponding to the logical high value instead of a voltage level corresponding to the logical low value as described in conjunction with FIG. 2 and FIGS. 3A-3B. In such configurations, the read disturb causes read word line RBL transitioning from the high logical value to the low logical value at different slopes for different logical values at the data node MB. A sense amplifier or input/output circuit for read word line RBL according to such configurations would have to be configured based on both the timing of detection and a separation in the voltage levels of read word line RBL for distinguishing the logical high value from the logical low value.

Compared with such configurations, under the read disturb, the embodiments illustrated in the present disclosure effectively hold read bit line at high logical level when data node MB has the low logical value and delay the transition of read word line RBL from the high logical value to the low logical value when data node MB has the high logical value. A sense amplifier or input/output circuit for read word line RBL according to the present disclosure could be configured able without considering the transitioning from the logical high value to the logical low value at the read word line RBL when data node MB has the low logical value. Compared with the other configurations described in the previous paragraph, the sense amplifier or input/output circuit for read word line RBL according to the present disclosure has fewer factors to be considered when being optimized against possible manufacturing variations.

Figure 3C:
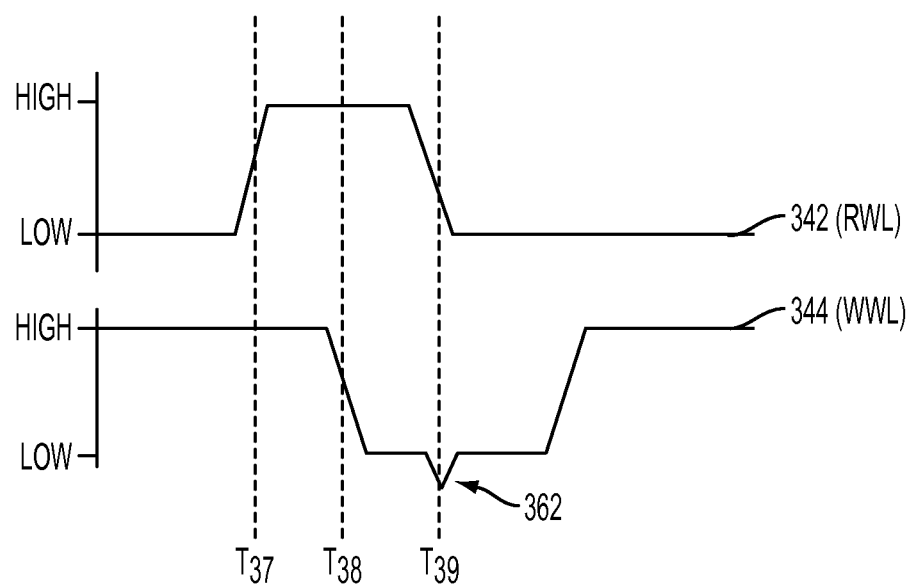

FIG. 3C is a graph of waveforms of various signals of the memory cell 200 in FIG. 2 in accordance with some embodiments. Curve 342 represents the signal on read word line RWL; and curve 344 represents the signal on write word line WWL.

FIG. 3C shows waveforms of read word line RWL and write word line WWL when memory cell 200 is accessed for a read operation and an overlapped write operation. In other words, during a time period that the read word line RWL is set to have the logical high value to turn on transistor 244 for a read operation, the write word line WWL is also set to have the logical low value to turn on transistors 232 and 234 for a write operation.

At time $T_{37}$, the signal 342 at read word line RWL transitions from the logical low value to the logical high value to turn on transistor 244. At time $T_{38}$, the signal 344 at write word line WWL transitions from the logical high value to the logical low value to turn on transistors 232 and 234. Then, at time $T_{39}$, the read operation on memory cell 200 is concluded, and the signal 342 at read word line RWL transitions from the logical high value to the logical low value to turn off transistor 244.

In some embodiments, at time $T_{39}$, the signal 344 at write word line WWL is pulled down a bit to have a signal glitch 362 because of signal cross-talking. Transistors 232 and 234 are P-type transistors and are thus configured to be biased to provide greater driving capability when the voltage level at corresponding gates are decreased. Therefore, the signal glitch 362 does not impact the performance of memory cell 200 in a way that causes the reduction of the driving capability of transistors 232 and 234. As a result, an alternating-current (AC) write margin of memory cell 200 is not negatively impacted by the cross-talking between read word line RWL and write word line WWL.

Figure 4:
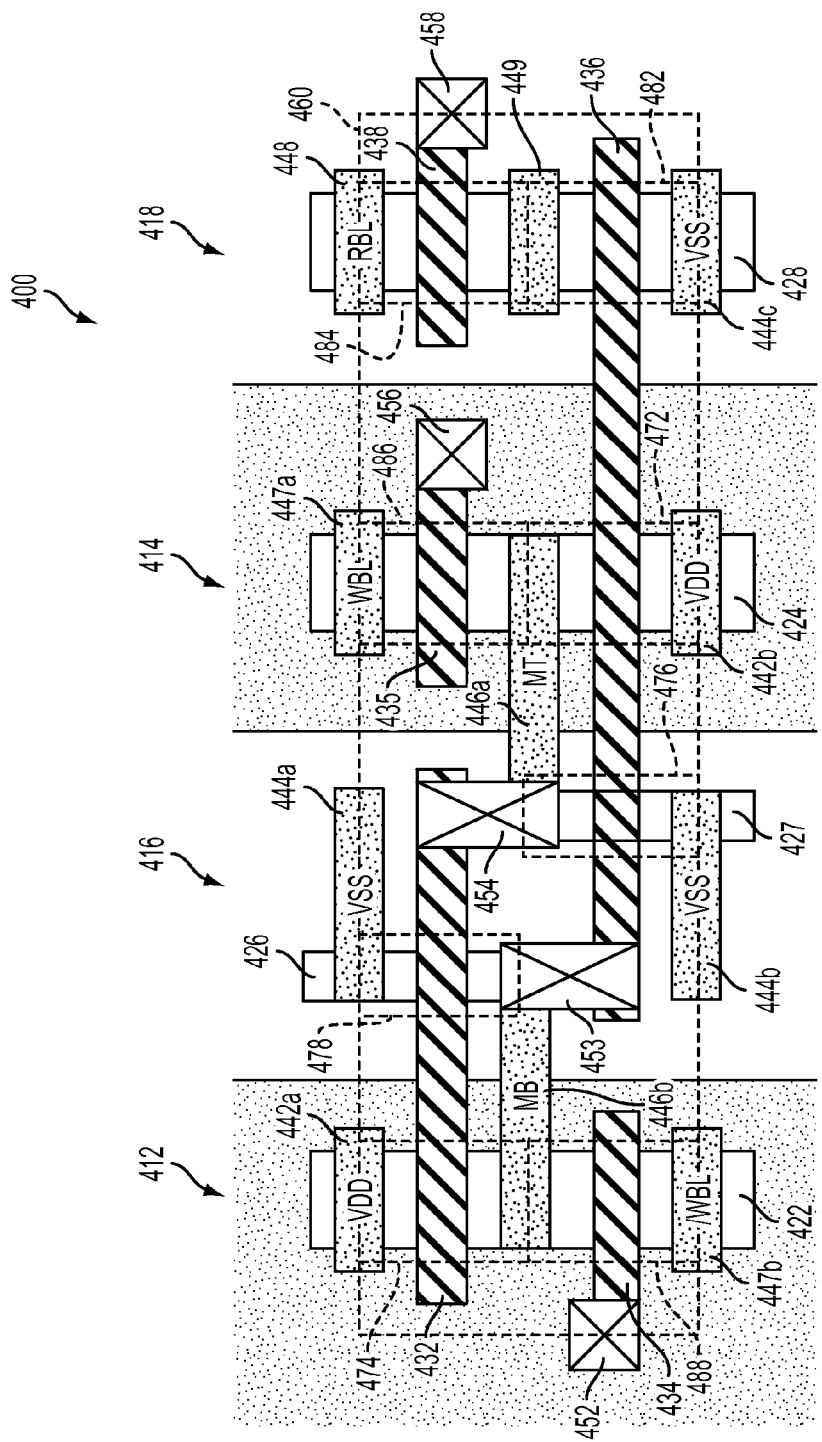
FIG. 4 is a layout diagram of the memory cell in FIG. 2 in accordance with some embodiments.

FIG. 4 is a layout diagram 400 of the memory cell in FIG. 2 in accordance with some embodiments. Layout diagram 400 includes N-well regions 412 and 414, and P-well regions 416 and 418. Layout diagram 400 further includes oxide-definition (OD) regions 422 and 424 indicating P-type implantation regions buried in corresponding N-well regions, and OD regions 426, 427, and 428 indicating N-type implantation regions buried in corresponding P-well regions.

Layout diagram 400 also includes polysilicon regions 432, 434, 435, 436, and 438, interconnection regions 442a, 442b, 444a, 444b, 444c, 446a, 446b, 447a, 447b, 448, and 449, and interconnection regions 452, 453, 454, 456, and 458. Interconnection regions 442a, 442b, 444a, 444b, 444c, 446a, 446b, 447a, 447b, 448, and 449 correspond to interconnection structures of a common layer. Interconnection regions 452, 453, 454, 456, and 458 correspond to interconnection structures of another common layer.

Within a cell boundary 460, interconnection region 442b, polysilicon region 436, OD region 424, and interconnection region 446a define a transistor 472 corresponding to transistor 212 in FIG. 2. Polysilicon region 436 corresponds to the gate of transistor 212, interconnection region 442b corresponds to reference node 252, and interconnection region 446a corresponds to reference node MT. Interconnection region 442a, polysilicon region 432, OD region 422, and interconnection region 446b define a transistor 474 corresponding to transistor 214. Polysilicon region 432 corresponds to the gate of transistor 214, interconnection region 442a corresponds to reference node 252, and interconnection region 446b corresponds to reference node MB. Interconnection region 453 connects interconnection regions 446b and polysilicon region 436. Interconnection region 454 connects interconnection regions 446a and polysilicon region 432.

Interconnection region 444b, polysilicon region 436, OD region 427, and interconnection region 446a define a transistor 476 corresponding to transistor 222. Polysilicon region 436 corresponds to the gate of transistor 222, and interconnection region 444b corresponds to reference node 254. Interconnection region 444a, polysilicon region 432, OD region 426, and interconnection region 446b define a transistor 478 corresponding to transistor 224. Polysilicon region 432 corresponds to the gate of transistor 224, and interconnection region 444a corresponds to reference node 252.

Interconnection region 444c, polysilicon region 436, OD region 428, and interconnection region 449 define a transistor 482 corresponding to transistor 242 in FIG. 2. Polysilicon region 436 corresponds to the gate of transistor 242, and interconnection region 444c corresponds to reference node 254. Interconnection region 448, polysilicon region 438, OD region 428, and interconnection region 449 define a transistor 482 corresponding to transistor 244. Polysilicon region 438 corresponds to the gate of transistor 244, and interconnection region 448 corresponds to a node to be connected with read word line RBL. Interconnection region 458 is connected to polysilicon region 438 and is to be connected with a read word line RWL.

Interconnection region 447a, polysilicon region 435, OD region 424, and interconnection region 446a define a transistor 486 corresponding to transistor 232. Polysilicon region 435 corresponds to the gate of transistor 232, and interconnection region 447a corresponds to a node to be connected with write word line WBL. Interconnection region 456 is connected to polysilicon region 435 and is to be connected with a write word line WWL. Interconnection region 447b, polysilicon region 434, OD region 422, and interconnection region 446b define a transistor 488 corresponding to transistor 234. Polysilicon region 434 corresponds to the gate of transistor 234, and interconnection region 447b corresponds to a node to be connected with write word line /WBL. Interconnection region 452 is connected to polysilicon region 434 and is to be connected with the write word line WWL.

Figure 5:
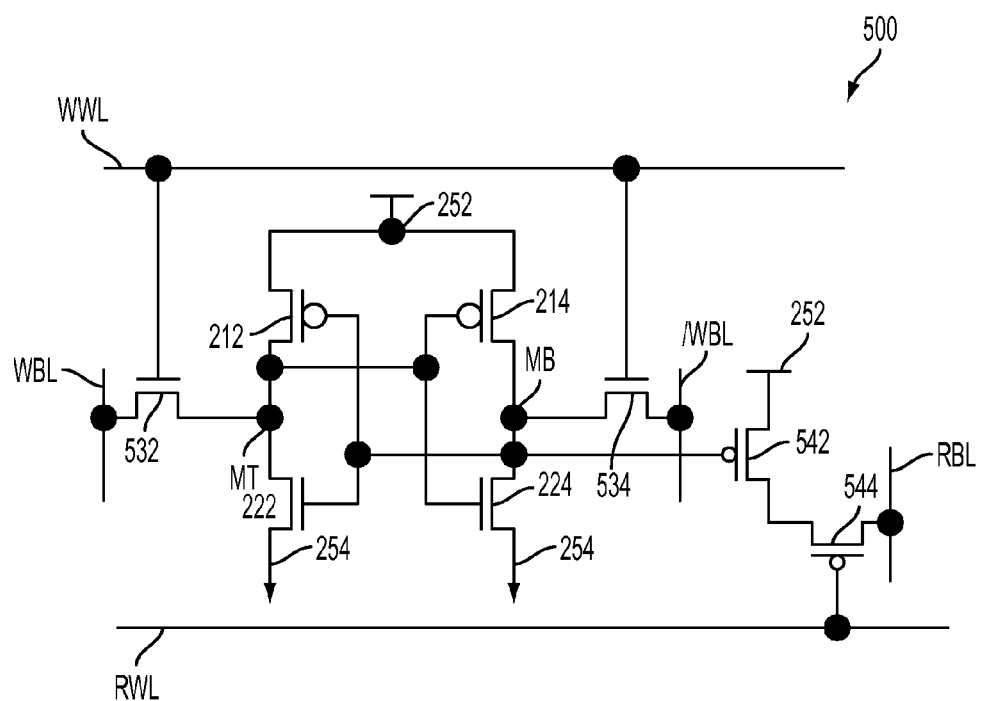
FIG. 5 is a diagram of a memory cell in accordance with some embodiments.

FIG. 5 is a diagram of a memory cell 500 in accordance with some embodiments. In some embodiments, memory cell 500 is usable in a memory circuit, such as memory circuit 100 in FIG. 1. The components in FIG. 5 that are the same or similar to those in FIG. 2 are given the same reference labels, and the description thereof are not repeated.

Compared with memory cell 200, memory cell 500 has N-type transistors 532 and 534 as pass gates for the write port and P-type transistors 542 and 544 for the read port. Memory cell 500 otherwise has a similar configuration as memory cell 200 and has similar electrical characteristics, except for swapping the signal polarities at some nodes due to the swapping of N-type or P-type transistors for the read port and the write port.

Transistor 532 is coupled between bit line WBL and data node MT. Transistor 534 is coupled between bit line /WBL and data node MB. Write word line WWL is coupled with gates of transistors 532 and 534. When memory cell 200 is accessed for a write operation, data to be written to memory cell 500 is applied to write bit lines WBL and /WBL. Write word line WWL is then activated, such as being set to have the logical high value, to turn on transistors 532 and 534. As a result, the data on bit lines WBL and /WBL is transferred to and is stored in corresponding data nodes MT and MTB.

Transistor 542 has a source coupled to reference node 252, a gate coupled to data node MB, and a drain coupled to transistor 544. Transistor 542 is configured to be turned off when the gate of transistor 542 has a voltage level corresponding to the logical high value, and to be turned on when the gate of transistor 542 has a voltage level corresponding to the logical low value. Transistor 544 is coupled between read bit line RBL and the drain of transistor 542. Read word line RWL is coupled with a gate of transistor 544. Transistor 544 functions as a pass gate controlled by read word line RWL.

When memory cell 500 is accessed for a read operation, read bit line is precharged to a voltage level corresponding to the logical low value. Then, read word line RWL is activated, such as being set to have the logical low value, to turn on transistor 544, and the drain of transistor 542 and read bit line RBL are electrically coupled together. If data node MB has a voltage level corresponding to the logical high value, transistor 542 is turned off and read bit line RBL remains at the logical low level. If data node MB has a voltage level corresponding to the logical low value, transistor 542 is turned on and pull read bit line RBL toward the voltage level at the reference node 252.

Figure 6A:
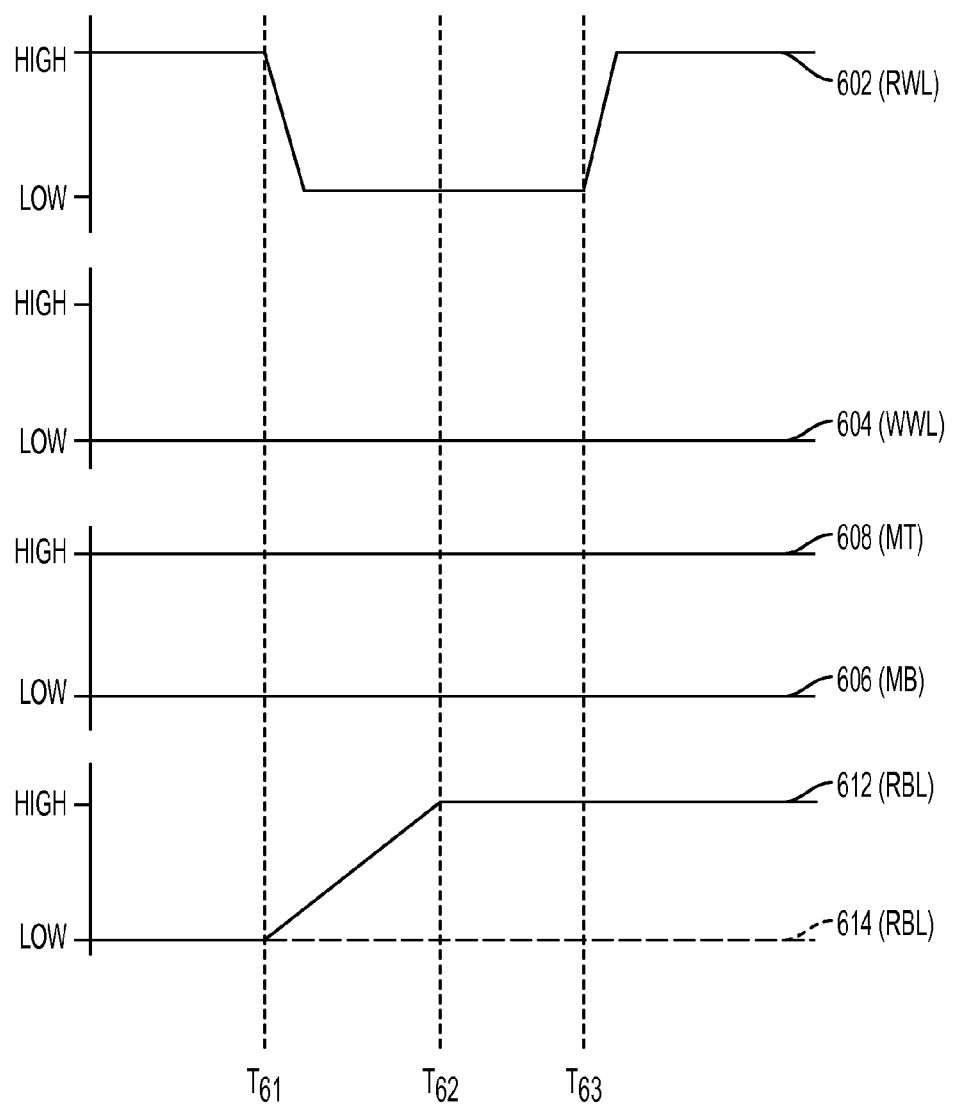
FIGS. 6A-6C are graphs of waveforms of various signals of the memory cell in FIG. 5 in accordance with some embodiments.

FIG. 6A is a graph of waveforms of various signals of the memory cell 500 in FIG. 5 in accordance with some embodiments. Curve 602 represents the signal on read word line RWL; curve 604 represents the signal on write word line WWL; curve 606 represents the signal on data node MB; curve 608 represents the signal on data node MT; and curve 612 represents the signal on read bit line RBL. Moreover, curve 614, depicted as a dotted line, represents the signal on read bit line RBL when the signal on data node MB has the waveform of curve 608 and the signal on data node MT has the waveform of curve 606.

FIG. 6A shows waveforms of various signals when memory cell 500 is accessed for a read operation without the read disturb. In other words, when the read word line RWL is set to have the logical low value to turn on transistor 544, the write word line WWL remains to have the logical low value to turn off transistors 532 and 534.

At time $T_{61}$, the signal 602 at read word line RWL starts to transition from the logical high value to the logical low value, and thus starts to turn on transistor 544. The signal 604 at write word line WWL remains at the logical low value to turn off transistors 532 and 534. As a result, write bit lines WBL and /WBL are electrically decoupled from data nodes MT and MB. Meanwhile, data node MB (606) has the logical low value and data node MT (608) has the logical high value prior to time $T_{61}$. Also, prior to time $T_{61}$, a voltage level at read bit line RBL (612) is precharged to the logical low value. Because signal 606 at data node MB has the logical low value, at time $T_{61}$, transistor 542 is turned on to electrically couple the drain of transistor 542 with reference node 252. As a result, the voltage level at read bit line RBL (612) starts to be pulled toward the voltage level at reference node 252, which represents the logical high value.

At time $T_{62}$, the signal 612 at read bit line RBL reaches the voltage level at reference node 252. Then, at time $T_{63}$, the signal 602 at read word line RWL starts to transition from the logical low value to the logical high value, and thus starts to turn off transistor 544. The read bit line RBL now has the logical high value indicating the data stored at node MT, or logically complementary to the data stored at node MB.

Furthermore, when the signal on data node MB has the waveform of curve 608 and the signal on data node MT has the waveform of curve 606, transistor 542 remains off throughout the time period including time $T_{61}$, $T_{62}$, and $T_{63}$. As a result, read bit line RBL is not electrically coupled to reference node 252, and signal 614 at read bit line RBL remains at the low logical value.

Figure 6B:
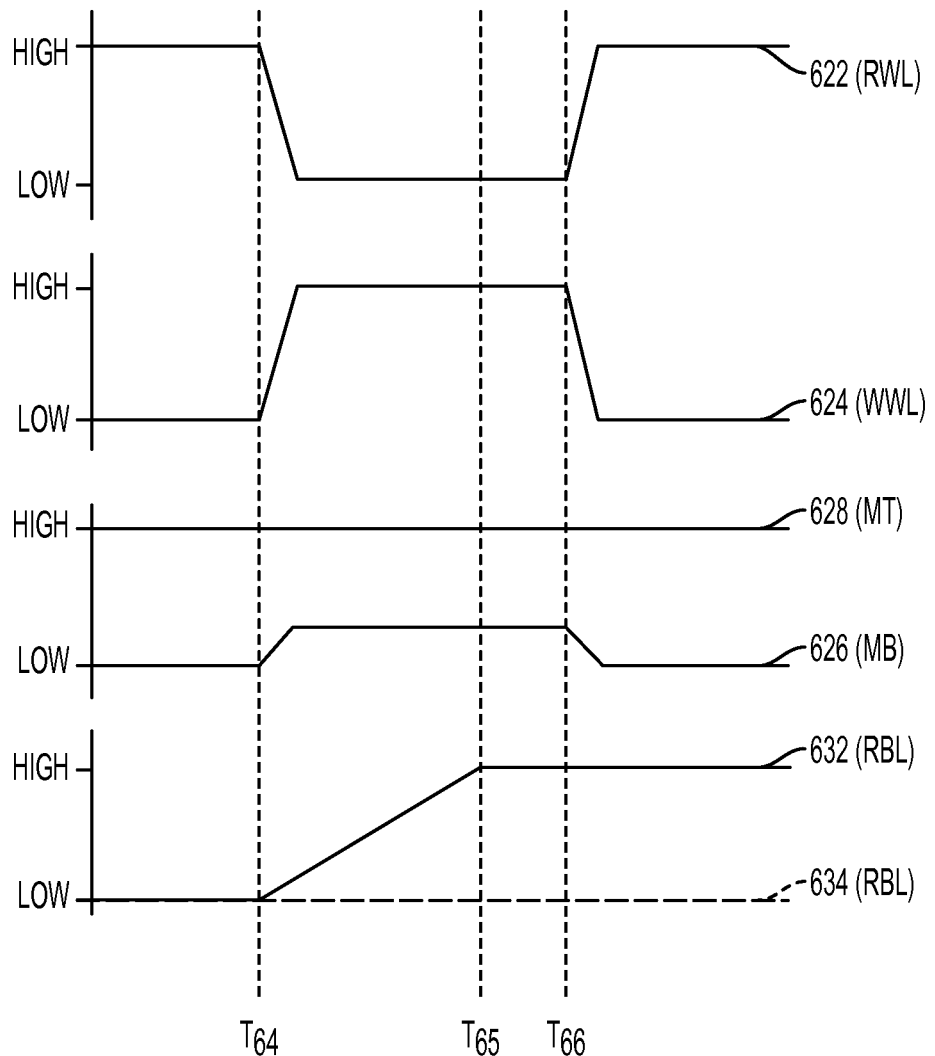

FIG. 6B is a graph of waveforms of various signals of the memory cell 500 in FIG. 2 in accordance with some embodiments. Curve 522 represents the signal on read word line RWL; curve 524 represents the signal on write word line WWL; curve 526 represents the signal on data node MB; curve 528 represents the signal on data node MT; and curve 532 represents the signal on read bit line RBL. Moreover, curve 534, depicted as a dotted line, represents the signal on read bit line RBL when the signal on data node MB has the waveform of curve 528 and the signal on data node MT has the waveform of curve 526.

FIG. 6B shows waveforms of various signals when memory cell 500 is accessed for a read operation with the read disturb. In other words, when the read word line RWL is set to have the logical low value to turn on transistor 544, the write word line WWL is also set to have the logical high value to turn on transistors 532 and 534. However, because the write port of memory cell 500 is not in fact selected for a write operation, write data line WBL and /WBL remain at a predetermined voltage level corresponding to the logical low value set by a corresponding precharging unit.

At time $T_{64}$, the signal 622 at read word line RWL starts to transition from the logical high value to the logical low value, and starts to turn on transistor 544. The signal 524 at write word line WWL also starts to transition from the logical low value to the logical high value, and starts to turn on transistors 532 and 534.

Meanwhile, data node MB (526) has the logical low value and data node MT (528) has the logical high value prior to time $T_{34}$. Because transistor 532 is turned on and write bit line /WBL is precharged or pulled toward the logical high value by the corresponding prechargind unit, the signal 526 at data node MB is pulled toward the voltage level that represents the logical high value. The signal 528 at data node MT remains at about the logical low value. In some embodiments, memory cell 500 is configured in a manner that the fluctuation of the signal 526 at data node MB is insufficient to cause the cross-coupled inverters formed by transistors 212, 214, 222, and 225 to flip the logical values stored at data nodes MB and MT.

Prior to time $T_{64}$, a voltage level at read bit line RBL (632) is precharged to the logical low value. Because signal 626 at data node MB has logical low value, at time $T_{64}$, transistor 542 is turned on to electrically couple the drain of transistor 542 with reference node 554. As a result, the voltage level at read bit line RBL (632) starts to be pulled toward the voltage level at reference node 252, which represents the logical high value. However, after time $T_{64}$, because the signal 626 at data node MB is pulled away from the logical low value, transistor 542 is biased to have less driving capability in comparison with transistor 542 without the read disturb as depicted in FIG. 6A.

At time $T_{65}$, the signal 632 at read bit line RBL reaches the voltage level at reference node 252. Because transistor 542 under the tread disturb has less driving capability than transistor 542 has without the read disturb, a time interval between $T_{63}$ and $T_{65}$ is longer than that between $T_{61}$ and $T_{62}$. Then, at time $T_{66}$, the signal 622 at read word line RWL starts to transition from the logical low value to the logical high value, and thus starts to turn off transistor 544. The read bit line RBL now has the logical high value indicating the data stored at node MT, or logically complementary to the data stored at node MB.

Furthermore, when the signal on data node MB has the waveform of curve 628 and the signal on data node MT has the waveform of curve 626, transistor 542 remains off throughout the time period including time $T_{64}$, $T_{65}$, and $T_{66}$. As a result, read bit line RBL is not electrically coupled to reference node 252, and signal 634 at read bit line RBL remains at the high logical value. After time $T_{66}$, the read bit line RBL has the logical low value indicating the data stored at node MT, or logically complementary to the data stored at node MB.

Figure 6C:
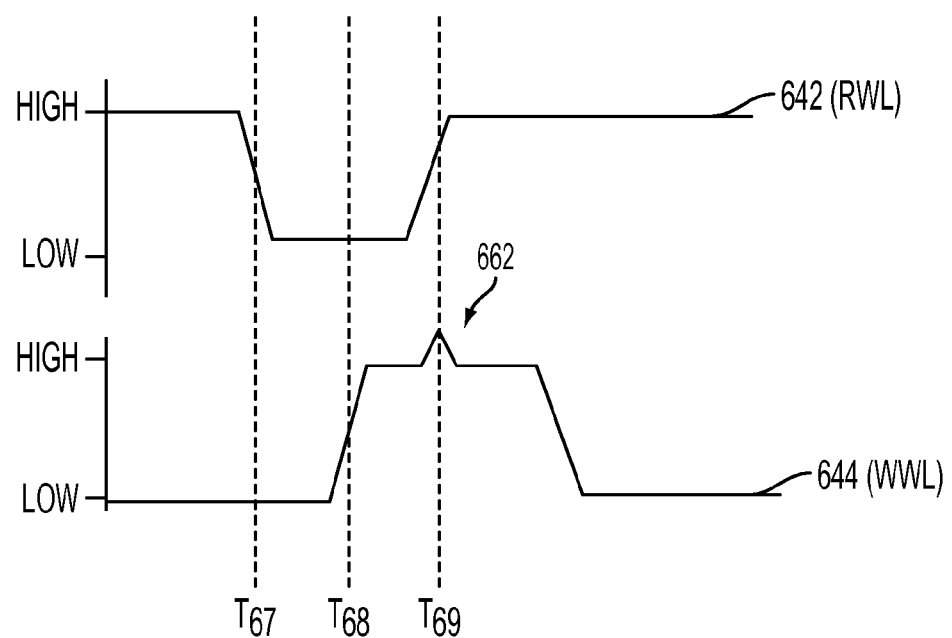

FIG. 6C is a graph of waveforms of various signals of the memory cell 500 in FIG. 5 in accordance with some embodiments. Curve 642 represents the signal on read word line RWL; and curve 644 represents the signal on write word line WWL.

Similar to the operation illustrated in conjunction with FIG. 3C, curves 642 and 644 relate to that memory cell 500 is accessed for a read operation and a write operation in an overlapped manner. At time $T_{67}$, the signal 642 at read word line RWL transitions from the logical high value to the logical low value to turn on transistor 544. At time $T_{68}$, the signal 644 at write word line WWL transitions from the logical low value to the logical high value to turn on transistors 532 and 534. Then, at time $T_{69}$, the read operation on memory cell 500 is concluded, and the signal 642 at read word line RWL transitions from the logical low value to the logical high value to turn off transistor 544.

In some embodiments, because of signal cross-talking, at time $T_{69}$, the signal 644 at write word line WWL is pulled high a bit to have a signal glitch 662. Transistors 532 and 534 are N-type transistors and are thus configured to be biased to provide greater driving capability when the voltage level at corresponding gates are increased. Therefore, the signal glitch 662 does not impact the performance of memory cell 500 in a way that causes the reduction of the driving capability of transistors 532 and 534. As a result, an AC write margin of memory cell 500 is not negatively impacted by the cross-talking between read word line RWL and write word line WWL.

Figure 7:
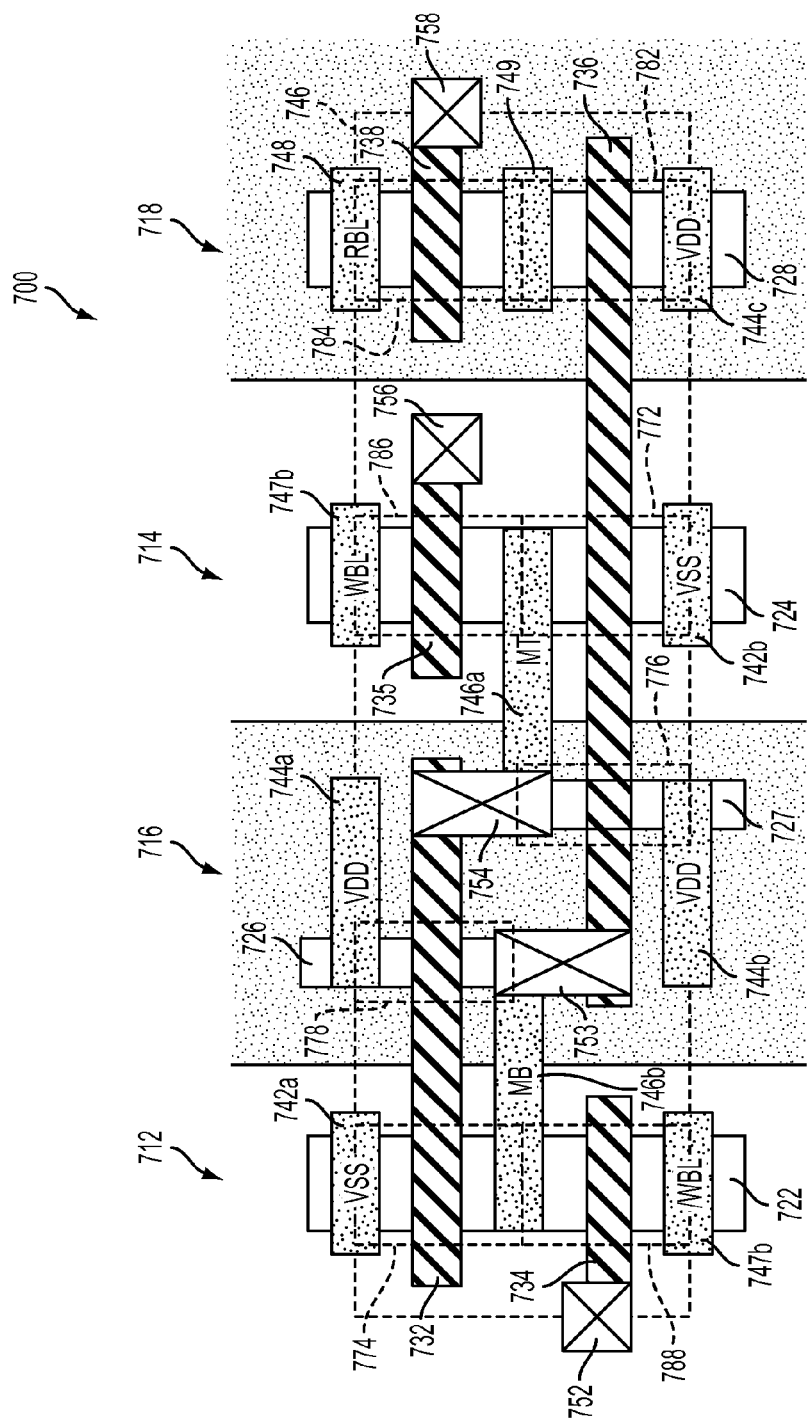
FIG. 7 is a layout diagram of the memory cell in FIG. 5 in accordance with some embodiments.

FIG. 7 is a layout diagram of the memory cell 500 in FIG. 5 in accordance with some embodiments. Layout diagram 400 includes P-well regions 712 and 714, and N-well regions 716 and 718. Layout diagram 400 further includes OD regions 722 and 724 indicating N-type implantation regions buried in corresponding P-well regions, and OD regions 726, 727, and 728 indicating P-type implantation regions buried in corresponding N-well regions.

Layout diagram 700 also includes polysilicon regions 732, 734, 735, 736, and 738, interconnection regions 742a, 742b, 744a, 744b, 744c, 746a, 746b, 747a, 747b, 748, and 749, and interconnection regions 752, 753, 754, 756, and 758. Interconnection regions 742a, 742b, 744a, 744b, 744c, 746a, 746b, 747a, 747b, 748, and 749 correspond to interconnection structures of a common layer. Interconnection regions 752, 753, 754, 756, and 758 correspond to interconnection structures of another common layer.

Within a cell boundary 760, various combinations of the OD regions, polysilicon regions, and interconnection regions define P-type transistors 776, 778, 782, and 784 and N-type transistors 772, 774, 786, and 788 in a manner similar to that of FIG. 4.

For example, transistor 772 corresponding to transistor 222 in FIG. 2; transistor 774 corresponding to transistor 224; transistor 776 corresponding to transistor 212; and transistor 778 corresponding to transistor 212. With regard to the read port, transistor 782 corresponds to transistor 542; and transistor 784 corresponds to transistor 544. With regard to the write port, transistor 786 corresponds to transistor 532; and transistor 788 corresponds to transistor 534.

Interconnection regions 742a and 742b correspond to the reference node 254, and interconnection regions 744a, 744b, and 744c correspond to the reference node 252. Interconnection regions 746a, 746b, 747a, 747b, and 748 variously correspond to data node MT, data node MB, write bit line WBL, write bit line /WBL, and read bit line RBL. Interconnection regions 752 and 756 correspond to write word line WBL; and interconnection region 758 correspond to read word line RWL.

Figure 8A:
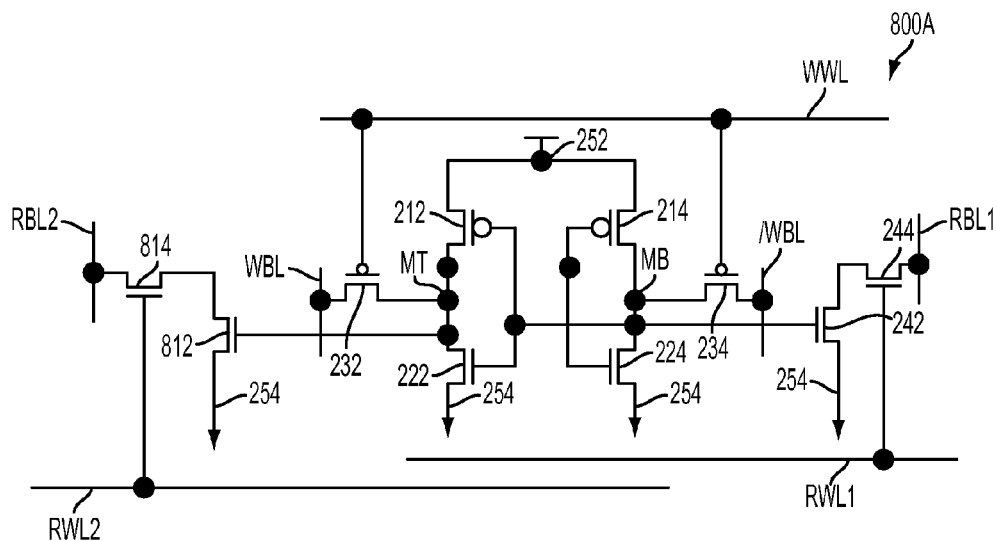
FIGS. 8A and 8B are diagrams of memory cells in accordance with some embodiments.

FIG. 8A is a diagram of memory cell 800A in accordance with some embodiments. The components in FIG. 8A that are the same or similar to those in FIG. 2 are given the same reference labels, and detailed description thereof is omitted.

In FIG. 2, memory cell 200 has one read port including transistors 242 and 244, read word line RBL, and read bit line RBL. Memory cell 800A has one read port including transistors 242 and 244, read word line RBL1 corresponding to read word line RWL, and read bit line RBL1 corresponding to read bit line RBL. In addition, memory cell 800A has a second read port including transistors 812 and 814, read word line RBL2, and read bit line RBL2. The second read port is configured in a manner similar to that of the first read port, except the second read port is configured to read the stored data from data node MT. In some embodiments, there are two or more read ports configured in a manner similar to that of the first read port or the second read port.

Figure 8B:
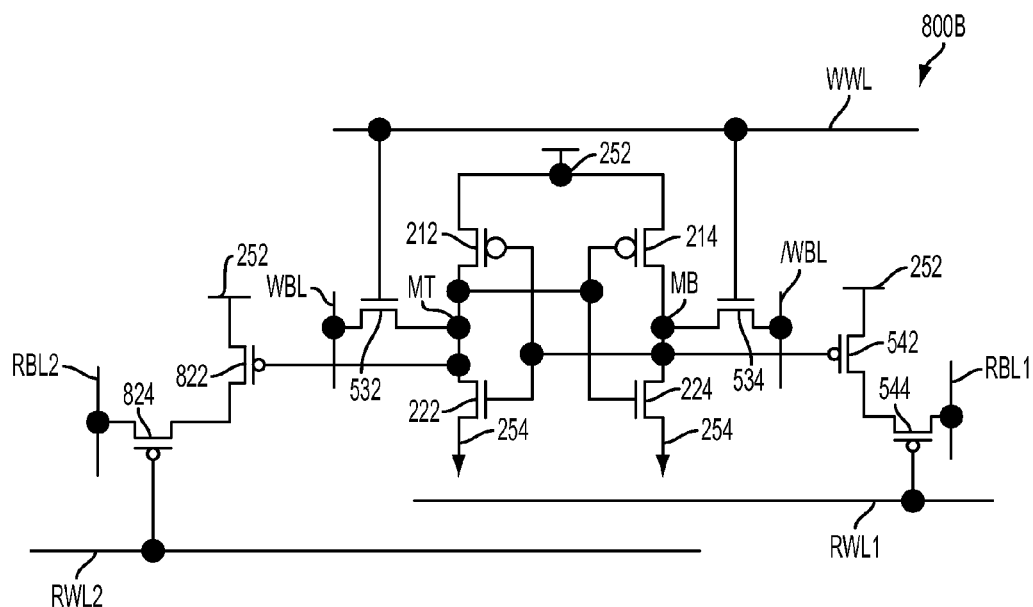

FIG. 8B is a diagram of memory cell 800B in accordance with some embodiments. The components in FIG. 8A that are the same or similar to those in FIG. 5 are given the same reference labels, and detailed description thereof is omitted. Compared with Compared with memory cell 500 and memory cell 800A, memory cell 800B has a first read port including transistors 542 and 544, read word line RBL1 corresponding to read word line RWL, and read bit line RBL1 corresponding to read bit line RBL. In addition, memory cell 800B has a second read port including transistors 822 and 824, read word line RBL2, and read bit line RBL2. In some embodiments, there are two or more read ports configured in a manner similar to that of the first read port or the second read port.

Figure 9:
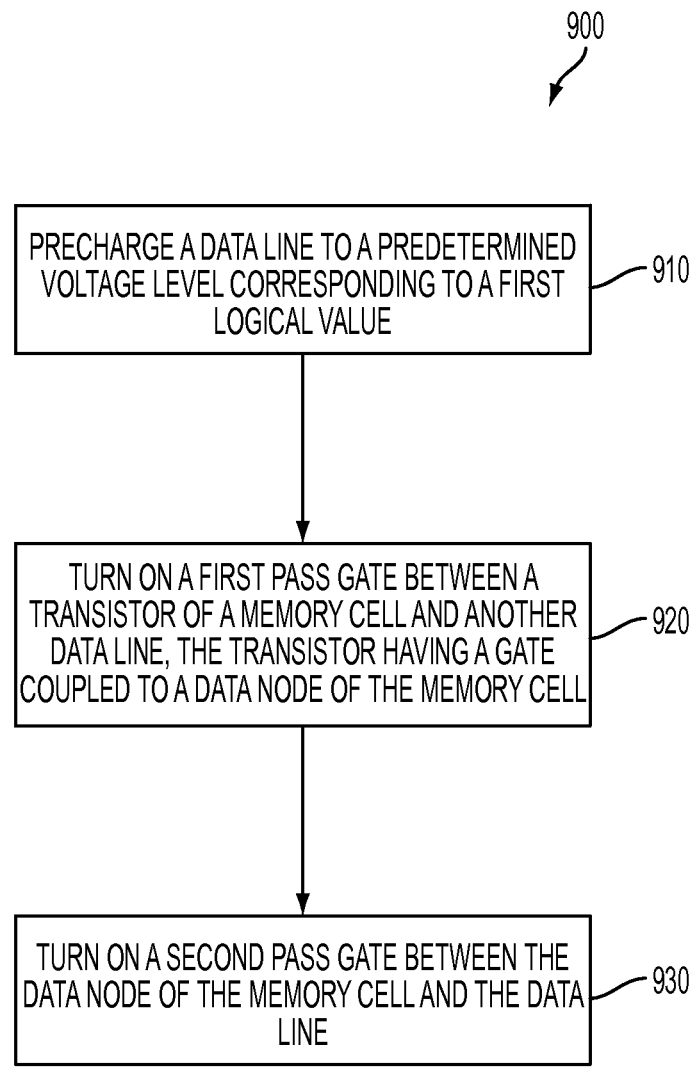
FIG. 9 is a flow chart of a method of operating a memory circuit in accordance with some embodiments.

FIG. 9 is a flow chart of a method 900 of operating a memory circuit, such as memory circuit 100 based on any of the memory cells 200, 500, 800A, or 800B, in accordance with some embodiments. It is understood that additional operations may be performed before, during, and/or after the method 900 depicted in FIG. 9, and that some other processes may only be briefly described herein.

The process begins with operation 910, where a data line, such as write bit line WBL or /WBL to a predetermined voltage, such as a voltage level corresponding to the logical low value for memory cell 200 and memory cell 800A or to the logical high value for memory cell 500 and memory cell 800B.

The process proceeds to operation 920, where a first pass gate between a transistor of a memory cell and another data line is turned on. For example, transistor 244 of memory cell 200 of memory cell 800A is turned on, or transistor 544 of memory cell 500 of memory cell 800B is turned on. A gate of the transistor is coupled to a data node of the memory cell. In some embodiments, the first pass gate is turned on responsive to a voltage level corresponding to a second logical value different from the first logical value. Therefore, in some embodiments, turning on the first pass gate is performed by causing a first word line coupled to the first pass gate, such as read word line RWL or RWL1, to have a first transition from a voltage level corresponding to the first logical value to a voltage level corresponding to the second logical value.

The process proceeds to operation 930, where a second pass gate between the data node of the memory cell and the data line is turned on. In some embodiments, the second pass gate is turned on responsive to a voltage level corresponding to the first logical value. Therefore, in some embodiments, turning on the second pass gate is performed by causing a second word line coupled to the second pass gate, such as write word line WWL, to have a second transition from a voltage level corresponding to the second logical value to a voltage level corresponding to the first logical value.

In accordance with one embodiment, a circuit includes a first data line, a second data line, a reference node, and a memory cell. The reference node is configured to have a reference voltage level corresponding to a first logical value. The memory cell includes a data node, a first transistor and a second transistor connected in series between the first data line and the reference node, and a third transistor between the data node and the second data line. A gate of the first transistor is coupled to the data node, and the first transistor is configured to be turned off when the gate of the first transistor has a voltage level corresponding to the first logical value. The third transistor is configured to be turned off when a gate of the third transistor has a voltage level corresponding to a second logical value different from the first logical value.

In accordance with another embodiment, a circuit includes a reference node, a memory cell, a first data line, a second data line, and a precharging unit. The reference node is configured to have a reference voltage level corresponding to a first logical value. The memory cell includes a data node, a first pass gate, a second pass gate, and a transistor. The transistor has a drain, a source, and a gate, where the gate of the transistor is coupled with the data node of the memory cell, and the source of the transistor is coupled with the reference node. The first pass gate of the memory cell is between the drain of the transistor and the first data line. The second pass gate of the memory cell is between the data node of the memory cell and the second data line. The precharging unit is configured to cause the second data line to have a predetermined voltage level corresponding to the first logical value.

In accordance with another embodiment, a method includes precharging a data line to a predetermined voltage level corresponding to a first logical value. A first pass gate between a transistor of a memory cell and another data line is turned on. The transistor has a drain coupled to the first pass gate, a source coupled to a reference node configured to have a reference voltage level corresponding to the first logical value, and a gate coupled to a data node of the memory cell. A second pass gate between the data node of the memory cell and the data line is turned on.

The foregoing outlines features of several embodiments so that those of ordinary skill in the art may better understand the aspects of the present disclosure. Those of ordinary skill in the art should appreciate that they may readily use the present disclosure as a basis for designing or modifying other circuits, processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A circuit, comprising:
  a reference node configured to have a reference voltage level corresponding to a first logical value;
  a memory cell, comprising:
   a data node;
   a first pass gate;
   a second pass gate; and
   a transistor having a drain, a source, and a gate, the gate of the transistor being coupled with the data node of the memory cell, and the source of the transistor being coupled with the reference node;
  a first data line, the first pass gate of the memory cell being between the drain of the transistor and the first data line;
  a second data line, the second pass gate of the memory cell being between the data node of the memory cell and the second data line; and
  a precharging unit configured to cause the second data line to have a predetermined voltage level corresponding to the first logical value.

2. The circuit of claim 1, wherein
  the first pass gate is configured to receive a first word line and to be turned off when the first word line has a voltage level corresponding to the first logical value; and
  the second pass gate is configured to receive a second word line and to be turned off when the second word line has a voltage level corresponding to a second logical value different from the first logic value.

3. The circuit of claim 1, wherein the transistor is an N-type transistor, and the second pass gate comprises a P-type transistor.

4. The circuit of claim 1, wherein the transistor is a P-type transistor, and the second pass gate comprises an N-type transistor.

5. The circuit of claim 1, wherein
  the memory cell further comprises:
  another data node;
  a third pass gate; and
  the circuit further comprises:
   a third data line, the third pass gate of the memory cell being between the another data node of the memory cell and the third data line.

6. The circuit of claim 1, wherein
the memory cell further comprises:
another data node;
a third pass gate; and
another transistor having a drain, a source, and a gate, the gate of the another transistor being coupled with the another data node of the memory cell, and the source of the another transistor being coupled with the reference node; and
the circuit further comprises:
a third data line, the third pass gate of the memory cell being between the drain of the another transistor and the third data line.

7. The circuit of claim 1, wherein the memory cell is a static random access memory (SRAM) cell.

8. A method, comprising:
precharging a data line to a predetermined voltage level corresponding to a first logical value;
turning on a first pass gate between a transistor of a memory cell and another data line, the transistor having a drain coupled to the first pass gate, a source coupled to a reference node configured to have a reference voltage level corresponding to the first logical value, and a gate coupled to a data node of the memory cell; and
turning on a second pass gate between the data node of the memory cell and the data line.

9. The method of claim 8, wherein
the turning on the first pass gate comprises causing a first word line coupled to the first pass gate to have a first transition from a voltage level corresponding to the first logical value to a voltage level corresponding to a second logical value different from the first logical value; and
the turning on the second pass gate comprises causing a second word line coupled to the second pass gate to have a second transition from a voltage level corresponding to the second logical level to a voltage level corresponding to the first logical value.

10. The method of claim 8, wherein
the turning on the first pass gate comprises setting a first word line coupled to the first pass gate to have a voltage level corresponding to a second logical value different from the first logical value; and
the turning on the second pass gate comprises setting a second word line coupled to the second pass gate to have a voltage level corresponding to the first logical value.

11. A circuit, comprising:
a memory cell configured to have a first data node, comprising:
a first transistor of a first type coupled between the first data node and a first data line, the first data line configured to be precharged to a predetermined voltage level, a gate terminal of the first transistor coupled to a first word line; and
a second transistor of a second type and a third transistor of the second type, the second transistor coupled between a second data line and the third transistor, a gate terminal of the second transistor coupled to a second word line, a gate terminal of the third transistor coupled to the first data node, a source terminal of the third transistor coupled to a reference node, and a drain terminal of the third transistor coupled to the second transistor.

12. The circuit of claim 11, wherein the first transistor is an N-type transistor, and the second transistor and the third transistor are P-type transistors.

13. The circuit of claim 11, wherein the first transistor is a P-type transistor, and the second transistor and the third transistor are N-type transistors.

14. The circuit of claim 11, further comprising:
a precharging unit coupled to the first data line or the second data line, the precharging unit configured to precharge the first data line or the second data line to the predetermined voltage level.

15. The circuit of claim 14, wherein the first data line is configured to be precharged to the predetermined voltage level when the first word line is deactivated, or the second data line is configured to be precharged to the predetermined voltage level when the second word line is deactivated.

16. The circuit of claim 11, wherein the memory cell further comprises:
a fourth transistor of the first type coupled between a second data node and a third data line, a gate terminal of the fourth transistor coupled to the first word line.

17. The circuit of claim 16, wherein the memory cell further comprises:
a fifth transistor of the second type; and
a sixth transistor of the second type, the fifth transistor coupled between a fourth data line and the sixth transistor, a gate terminal of the fifth transistor coupled to a third word line, a gate terminal of the sixth transistor coupled to the second data node, a source terminal of the sixth transistor coupled to the reference node, and a drain terminal of the sixth transistor coupled to the fifth transistor.

18. The circuit of claim 16, wherein the third data line is configured to be precharged to the predetermined voltage level.

19. The circuit of claim 17, wherein the first data line and the third data line are write data lines, and the second data line and the fourth data line are read data lines.

20. The circuit of claim 17, wherein the first word line is a write word line, and the second word line and the third word line are read word lines.

* * * * *